United States Patent
Min et al.

(10) Patent No.: US 10,032,835 B2
(45) Date of Patent: Jul. 24, 2018

(54) ORGANIC LIGHT-EMTTING DISPLAY APPARATUS AND METHOD OF MANUFACTURING SAME

(71) Applicant: Samsung Display Co., Ltd., Yongin, Gyeonggi-Do (KR)

(72) Inventors: Kyung-Soo Min, Yongin (KR); Yeon-Heok You, Yongin (KR); Dong-Wook Kang, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/108,147

(22) Filed: Dec. 16, 2013

(65) Prior Publication Data

US 2015/0021565 A1    Jan. 22, 2015

(30) Foreign Application Priority Data

Jul. 22, 2013 (KR) .................. 10-2013-0086253

(51) Int. Cl.
*H01L 51/52* (2006.01)
*H01L 27/32* (2006.01)

(52) U.S. Cl.
CPC ...... *H01L 27/3244* (2013.01); *H01L 51/5253* (2013.01); *H01L 51/5256* (2013.01); *H01L 27/3258* (2013.01)

(58) Field of Classification Search
CPC .................. H01L 51/5253; H01L 51/5256
See application file for complete search history.

(56) References Cited

U.S. PATENT DOCUMENTS

| 2001/0044035 | A1  | 11/2001 | Morii |
| 2003/0230976 | A1* | 12/2003 | Nishikawa .......... H01L 51/5253 313/504 |
| 2005/0158579 | A1* | 7/2005  | Marks et al. ................ 428/690 |
| 2005/0180721 | A1  | 8/2005  | Hayashi et al. |
| 2005/0242720 | A1  | 11/2005 | Sano et al. |

(Continued)

FOREIGN PATENT DOCUMENTS

| CN | 1652645 A     | 8/2005 |
| JP | 2001-338754 A | 12/2001 |

(Continued)

OTHER PUBLICATIONS

EPO Search Report dated Mar. 13, 2015, for corresponding European Patent application 14167532.2, (9 pages).

(Continued)

*Primary Examiner* — Daniel Luke
(74) *Attorney, Agent, or Firm* — Lewis Roca Rothgerber Christie LLP

(57) ABSTRACT

An organic light-emitting display apparatus including: a substrate; a display unit having a plurality of organic light-emitting devices on the substrate; an encapsulating layer sealing up the display unit; and a protective layer between the display unit and the encapsulating layer, wherein each of the plurality of organic light-emitting devices includes: a pixel electrode; an intermediate layer on the pixel electrode, the intermediate layer including an organic emission layer; and an opposite electrode on the intermediate layer, and the protective layer includes: a capping layer covering the opposite electrode; and a blocking layer on the capping layer.

32 Claims, 5 Drawing Sheets

(56) References Cited

U.S. PATENT DOCUMENTS

| | | |
|---|---|---|
| 2005/0263775 A1 | 12/2005 | Ikeda et al. |
| 2006/0088951 A1 | 4/2006 | Hayashi et al. |
| 2007/0281174 A1 | 12/2007 | Moro et al. |
| 2008/0238301 A1 | 10/2008 | Shim et al. |
| 2010/0163859 A1* | 7/2010 | Yamazaki ............ H01L 21/6835 257/40 |
| 2011/0127498 A1* | 6/2011 | Jung ................... H01L 51/5237 257/40 |
| 2011/0148831 A1 | 6/2011 | Tamaki et al. |
| 2011/0151200 A1 | 6/2011 | Erlat et al. |
| 2011/0163330 A1 | 7/2011 | Kim et al. |
| 2012/0153308 A1 | 6/2012 | Oh et al. |
| 2012/0319141 A1* | 12/2012 | Kim ...................... H01L 51/525 257/88 |
| 2013/0126837 A1* | 5/2013 | Kim et al. ......................... 257/40 |
| 2013/0161680 A1 | 6/2013 | Oh et al. |
| 2013/0168712 A1 | 7/2013 | Jeong et al. |
| 2013/0181602 A1 | 7/2013 | Kang et al. |
| 2014/0138634 A1* | 5/2014 | Lee et al. ......................... 257/40 |
| 2014/0138651 A1* | 5/2014 | Oh ...................... H01L 51/5253 257/40 |
| 2016/0013445 A1* | 1/2016 | Isaji .................... H01L 51/5253 257/40 |

FOREIGN PATENT DOCUMENTS

| | | |
|---|---|---|
| JP | 2002-033186 A | 1/2002 |
| JP | 2005-317476 A | 11/2005 |
| JP | 2006-4917 A | 1/2006 |
| JP | 2008-305557 | 12/2008 |
| JP | 2011-192660 A | 9/2011 |
| JP | 2012-89436 A | 5/2012 |
| JP | 2013-134989 A | 7/2013 |
| JP | 2013-140791 A | 7/2013 |
| JP | 2014-103111 A | 6/2014 |
| KR | 2001-0092414 A | 10/2001 |
| KR | 10-2006-0116561 A | 11/2006 |

OTHER PUBLICATIONS

EP Office action dated Jun. 16, 2017 for European Application No. 14167532.2, 6 pages.

\* cited by examiner

ORGANIC LIGHT-EMTTING DISPLAY APPARATUS AND METHOD OF MANUFACTURING SAME

CROSS-REFERENCE TO RELATED APPLICATION

This application claims priority to and the benefit of Korean Patent Application No. 10-2013-0086253, filed on Jul. 22, 2013, in the Korean Intellectual Property Office, the disclosure of which is incorporated herein in its entirety by reference.

BACKGROUND

1. Field

One or more embodiments of the present invention relate to an organic light-emitting display apparatus and a method of manufacturing the same.

2. Description of the Related Art

An organic light-emitting display apparatus using an organic light-emitting device is capable of playing a video with a quicker response speed than that of a comparable liquid crystal display (LCD), has a wide angle of view with self-emission and high brightness, and is becoming a next-generation display apparatus.

The organic light-emitting device usually includes a pixel electrode, an opposite electrode that faces the pixel electrode, and an emission layer between the pixel electrode and the opposite electrode, the emission layer including an organic material. Since the organic light-emitting device is very sensitive to humidity, oxygen, light, and the like, there may occur a pixel shrinkage phenomenon, when an emission region is gradually reduced when the organic light-emitting device is in contact with humidity, oxygen, light, and the like. In addition, the pixel shrinkage phenomenon may occur due to the oxidation of the pixel electrode.

Furthermore, when oxygen, humidity, and the like are diffused into the emission layer, an electrochemical charge moving reaction occurs at an interface between an electrode and an organic material layer. Such reaction generates an oxide that separates the organic material layer from the pixel electrode or the opposite electrode and causes a phenomenon, such as a dark spot, which reduces the life span of the organic light-emitting device.

SUMMARY

Aspects of embodiments of the present invention are directed toward an organic light-emitting display apparatus, capable of increasing its life span by improving a pixel shrinkage problem, and a method of manufacturing the same.

Additional aspects will be set forth in part in the description which follows and, in part, will be apparent from the description, or may be learned by practice of the presented embodiments.

According to one or more embodiments of the present invention, an organic light-emitting display apparatus includes: a substrate; a display unit having a plurality of organic light-emitting devices on the substrate; an encapsulating layer sealing up the display unit; and a protective layer between the display unit and the encapsulating layer, wherein each of the plurality of organic light-emitting devices includes: a pixel electrode; an intermediate layer on the pixel electrode, the intermediate layer including an organic emission layer; and an opposite electrode on the intermediate layer, and the protective layer includes: a capping layer covering the opposite electrode; and a blocking layer on the capping layer.

The capping layer may be formed of an organic material.

The blocking layer may be formed of a lithium fluoride (LiF).

The blocking layer may cover the capping layer.

The encapsulating layer may have a structure including at least a first inorganic layer, a first organic layer, and a second inorganic layer that are sequentially stacked.

The first inorganic layer may be formed of an aluminum oxide ($AlO_x$).

The blocking layer may cover the capping layer.

An area of the first organic layer may be greater than that of the blocking layer.

An area of the first inorganic layer may be greater than that of the first organic layer.

The encapsulating layer may further include a second organic layer on the second inorganic layer, and a third inorganic layer on the second organic layer.

An area of the first inorganic layer may be greater than that of the first organic layer.

The blocking layer may cover the capping layer, an area of the first organic layer may be greater than that of the blocking layer, and an area of the second organic layer may be greater than that of the first organic layer.

An area of each of the second inorganic layer and the third inorganic layer may be greater than that of the first inorganic layer.

According to one or more embodiments of the present invention, an organic light-emitting display apparatus includes: a substrate; a display unit having a plurality of organic light-emitting devices on the substrate; an encapsulating layer sealing up the display unit and including at least a porous inorganic layer, a first organic layer, and a second inorganic layer that are sequentially stacked; and a protective layer between the display unit and the encapsulating layer, wherein each of the plurality of organic light-emitting devices includes: a pixel electrode; an intermediate layer on the pixel electrode, the intermediate layer including an organic emission layer; and an opposite electrode on the intermediate layer, and the protective layer includes: a capping layer covering the opposite electrode; and a porous blocking layer on the capping layer.

The capping layer may be formed of an organic material.

The porous blocking layer may be formed of a lithium fluoride (LiF).

The porous inorganic layer may be formed of an aluminum oxide ($AlO_x$).

The porous blocking layer may cover the capping layer.

An area of the first organic layer may be greater than that of the porous blocking layer.

An area of the porous inorganic layer may be greater than that of the first organic layer.

The encapsulating layer may further include a second organic layer on the second inorganic layer, and a third inorganic layer on the second organic layer.

An area of the porous inorganic layer may be greater than that of the first organic layer.

The porous blocking layer may cover the capping layer, an area of the first organic layer may be greater than that of the porous blocking layer, and an area of the second organic layer may be greater than that of the first organic layer.

An area of each of the second inorganic layer and the third inorganic layer may be greater than that of the porous inorganic layer.

According to one or more embodiments of the present invention, a method of manufacturing an organic light-emitting display apparatus includes: forming a display unit on a substrate, the display unit defining an active area and including an opposite electrode; forming a capping layer to cover the opposite electrode; forming a blocking layer on the capping layer; and forming an encapsulating layer on the blocking layer to seal up the display unit.

The capping layer may be formed of an organic material.

The blocking layer may be formed of a lithium fluoride (LiF).

The blocking layer may be formed to cover the capping layer.

The forming of the encapsulating layer may include: forming a first inorganic layer on the blocking layer; forming a first organic layer on the first inorganic layer; and forming a second inorganic layer on the first organic layer.

The first inorganic layer may be formed of an aluminum oxide ($AlO_x$) by a sputtering method.

An area of the first inorganic layer may be greater than that of the first organic layer.

The blocking layer may be formed to cover the capping layer, and an area of the first organic layer may be greater than that of the blocking layer.

The method may further include: forming a second organic layer on the second inorganic layer; and forming a third inorganic layer on the second organic layer, wherein the second inorganic layer and the third inorganic layer are formed by a chemical vapor deposition (CVD) method.

An area of the first inorganic layer may be greater than that of the first organic layer.

The blocking layer may be formed to cover the capping layer, an area of the first organic layer may be greater than that of the blocking layer, and an area of the second organic layer may be greater than that of the first organic layer.

An area of each of the second inorganic layer and the third inorganic layer may be greater than that of the first inorganic layer.

The blocking layer may be formed of LiF having a pin-hole structure.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
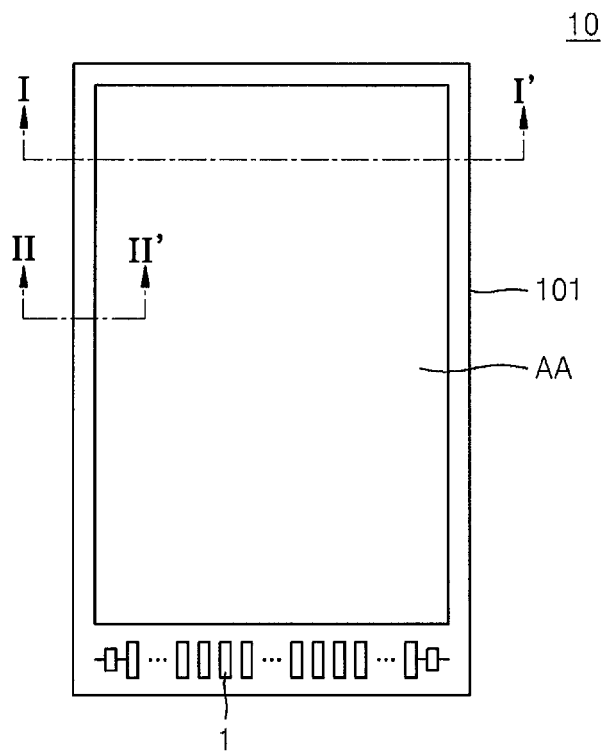
FIG. 1 is a schematic top view of an organic light-emitting display apparatus according to an embodiment of the present invention.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. In the following description, well-known functions or constructions are not described in detail so as not to obscure the invention with unnecessary detail.

It will be understood that although the terms "first", "second", etc. may be used herein to describe various components, these components should not be limited by these terms. These components are only used to distinguish one component from another.

It will be understood that when a layer, region, or component is referred to as being "formed on," another layer, region, or component, it can be directly or indirectly formed on the other layer, region, or component. That is, for example, intervening layers, regions, or components may be present.

Embodiments of the present invention will now be described more fully with reference to the accompanying drawings. Like reference numerals in the drawings denote like elements, and thus their duplicative descriptions will not be provided again. In the drawings, the thicknesses of some layers and regions are exaggerated for convenience of description. Some layers and regions are also magnified for clarity.

As used herein, the term "and/or" includes any and all combinations of one or more of the associated listed items. Expressions such as "at least one of," when preceding a list of elements, modify the entire list of elements and do not modify the individual elements of the list.

Further, the use of "may" when describing embodiments of the present invention refers to "one or more embodiments of the present invention."

Figure 2:
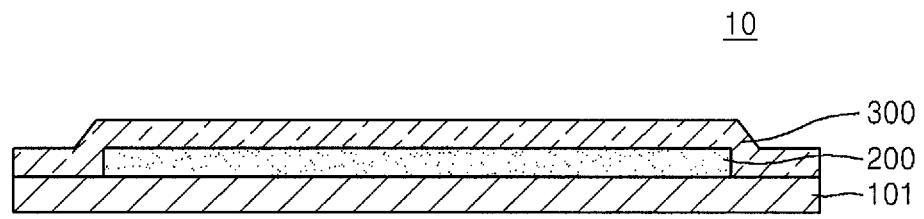
FIG. 2 is a cross-sectional view along line I-I' region of the organic light-emitting display apparatus of FIG. 1.
Figure 3:
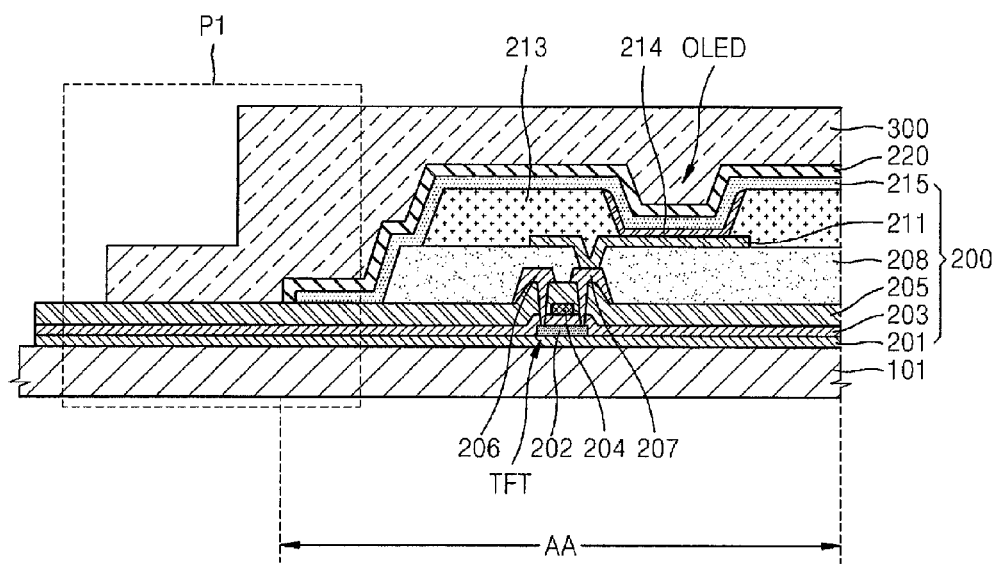
FIG. 3 is a cross-sectional view along line II-II' region of the organic light-emitting display apparatus of FIG. 1.
Figure 4:
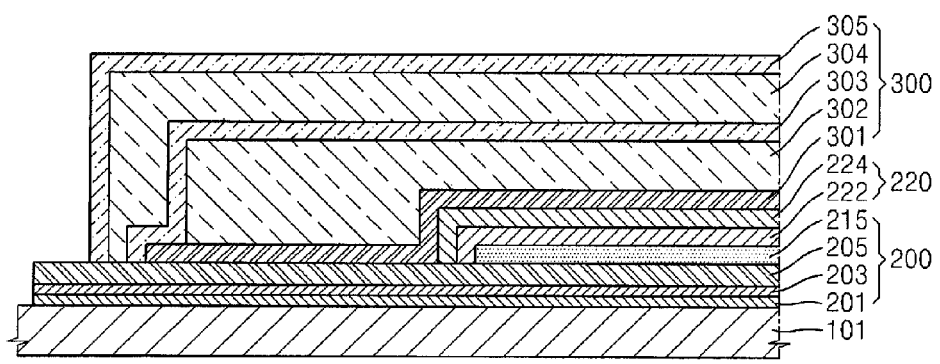
FIG. 4 is a magnified view of a region P1 in FIG. 3.

FIG. 1 is a schematic top view of an organic light-emitting display apparatus 10 according to an embodiment of the present invention, FIG. 2 is a cross-sectional view along line I-I of the organic light-emitting display apparatus 10 of FIG. 1, FIG. 3 is a cross-sectional view along line II-II' of the organic light-emitting display apparatus 10 of FIG. 1, and FIG. 4 is a magnified view of a region P1 in FIG. 3.

Referring to FIGS. 1 to 4, the organic light-emitting display apparatus 10 according to an embodiment of the present invention may include a substrate 101, a display unit 200 that defines an active area AA on the substrate 101, and an encapsulating layer 300 that seals up the display unit 200.

The substrate 101 may be a flexible substrate and may be formed of a plastic having good heat resistance and durability, such as polyimide, polyethylene terephthalate (PET), polycarbonate, polyethylene naphthalate, polyarylate (PAR), polyetherimide, or the like. However, one or more embodiments of the present invention are not limited thereto, and the substrate 101 may be formed of various other suitable materials, such as a metal, glass, or the like.

In some embodiments, the display unit 200 defines the active area AA on the substrate 101 and may include a thin film transistor TFT and an organic light-emitting device OLED electrically connected to the thin film transistor TFT. A pad part 1 may be disposed around the active area AA to deliver an electrical signal from a power supply device or a signal generation device to the active area AA.

The display unit 200 will now be described in more detail with reference to FIG. 3.

A buffer layer 201 may be formed on the substrate 101. In this case, the buffer layer 201 is formed on the entire surface of the substrate 101, i.e., both in the active area AA and in an outer area outside of the active area AA. In some embodiments, the buffer layer 201 is formed to provide a planarized plane on the substrate 101, and functions to effectively prevent the infiltration of impurity elements through the substrate 101. The buffer layer 201 may be formed of various materials suitable for use in organic light-emitting devices.

For example, the buffer layer 201 may include an inorganic material, such as a silicon oxide, a silicon nitride, a silicon oxynitride, an aluminum oxide, an aluminum nitride, a titanium oxide, a titanium nitride, or the like, or an organic material, such as polyimide, polyester, acryl, or the like, and may be formed by stacking a plurality of materials from among the materials described above.

The thin film transistor TFT may be formed on the buffer layer 201. The thin film transistor TFT may include an active layer 202, a gate electrode 204, a source electrode 206, and a drain electrode 207.

The active layer 202 may be formed of an inorganic semiconductor, such as an amorphous silicon or a polysilicon, an organic semiconductor, or an oxide semiconductor, and may include a source region, a drain region, and a channel region.

A gate insulating layer 203 may be formed on the active layer 202. In some embodiments, the gate insulating layer 203 is formed to correspond to the entire surface of the substrate 101. That is, in some embodiments, the gate insulating layer 203 is formed to correspond both to the active area AA and the outer area outside of the active area AA. The gate insulating layer 203 may provide insulation between the active layer 202 and the gate electrode 204 and may be formed of an organic material or an inorganic material, such as a silicon nitride ($SiN_x$) or a silicon oxide ($SiO_2$).

The gate electrode 204 may be formed on the gate insulating layer 203. The gate electrode 204 may include gold (Au), silver, (Ag), copper (Cu), nickel (Ni), platinum (Pt), palladium (Pd), aluminum (Al), molybdenum (Mo), or an alloy, such as an Al:neodymium (Nd) alloy, a Mo:tungsten (W) alloy, or the like. However, the gate electrode 204 is not limited thereto and may be formed of various suitable materials by considering design conditions.

An interlayer insulating layer 205 may be formed on the gate electrode 204. In an embodiment of the present invention, the interlayer insulating layer 205 is formed to correspond to the entire surface of the substrate 101. That is, in some embodiments, the interlayer insulating layer 205 is formed to correspond both to the active area AA and the outer area outside of the active area AA.

In some embodiments, the interlayer insulating layer 205 is disposed between the gate electrode 204 and the source electrode 206 and, in some embodiments between the gate electrode 204 and the drain electrode 207, for insulation therebetween, and may be formed of an inorganic material, such as $SiN_x$, $SiO_2$, or the like. In the current embodiment, the interlayer insulating layer 205 may be formed of $SiN_x$ or may be a two-layer structure formed of a $SiN_x$ layer and a $SiO_2$ layer.

The source electrode 206 and the drain electrode 207 may be formed on the interlayer insulating layer 205. In some embodiments, the interlayer insulating layer 205 and the gate insulating layer 203 are formed to expose the source region and the drain region of the active layer 202, and the source electrode 206 and the drain electrode 207 are formed to contact the exposed source and drain regions of the active layer 202.

Although FIG. 3 illustrates a top-gate type thin film transistor TFT that sequentially includes the active layer 202, the gate electrode 204 and the source and drain electrodes 206 and 207, one or more of the above embodiments of the present invention are not limited thereto, and the gate electrode 204 may be disposed below the active layer 202.

The thin film transistor TFT is electrically connected to the organic light-emitting device OLED to drive the organic light-emitting device OLED, and is protected by a passivation layer 208 that covers the thin film transistor TFT.

The passivation layer 208 may include an inorganic insulating layer and/or an organic insulating layer. Non-limiting examples of the inorganic insulating layer include a silicon oxide ($SiO_2$), a silicon nitride ($SiN_x$), a silicon oxynitride (SiON), an aluminum oxide ($Al_2O_3$), a titanium oxide ($TiO_2$), a tantalum oxide ($Ta_2O_5$), a hafnium oxide ($HfO_2$), a zirconium oxide ($ZrO_2$), a barium stannate titanate (BST), a lead zirconate titanate (PZT), or the like, and non-limiting examples of the organic insulating layer include a typical general-use polymer (polymethylmethacrylate (PMMAi) or polystyrene (PS)), a polymer derivative having a phenol group, an acryl group polymer, an imide group polymer, an aryl ether group polymer, an amide group polymer, a fluorine group polymer, a p-xylene group polymer, a vinyl alcohol group polymer, a blend thereof, or the like. The passivation layer 208 may be formed by stacking an inorganic insulating layer and an organic insulating layer.

The organic light-emitting device OLED may be formed on the passivation layer 208 and may include a pixel electrode 211, an intermediate layer 214, and an opposite electrode 215.

The pixel electrode 211 may be formed on the passivation layer 208. For example, the passivation layer 208 may be formed to expose a set or predetermined region of the drain electrode 207 without covering the entire drain electrode 207, and the pixel electrode 211 may be formed to be connected to the exposed region of the drain electrode 207.

In one embodiment, the pixel electrode 211 may be a reflective electrode and may include a reflective layer formed of Ag, Mg, Al, Pt, Pd, Au, Ni, Nd, iridium (Ir), chromium (Cr), a compound thereof, or the like, and a transparent or translucent electrode layer formed on the reflective layer. The transparent or translucent electrode layer may include at least one selected from the group consisting of an indium tin oxide (ITO), an indium zinc oxide (IZO), a zinc oxide (ZnO), an indium oxide ($In_2O_3$), an indium gallium oxide (IGO), and an aluminum zinc oxide (AZO).

The opposite electrode 215 positioned to face the pixel electrode 211 may be a transparent or translucent electrode and may be formed of a metal thin film having a small work function, including lithium (Li), calcium (Ca), lithium fluoride (LiF)/Ca, LiF/Al, Al, Ag, magnesium (Mg), or a compound thereof. The opposite electrode 215 may be formed with the thickness of about 5 nm to about 20 nm. In addition, an auxiliary electrode layer or a bus electrode may be further included and formed of a material for forming a transparent electrode, such as an ITO, an IZO, a ZnO, an $In_2O_3$, or the like.

In some embodiments, the opposite electrode 215 may allow the light emitted by an organic emission layer of the intermediate layer 214 to pass through. The light emitted by the organic emission layer may be directly emitted towards the opposite electrode 215 or may be reflected by the pixel electrode 211, which includes a reflective electrode, and then emitted towards the opposite electrode 215.

However, the flexible display apparatus 10 according to the current embodiment is not limited to a top emission type, and the light emitted by the organic emission layer may be emitted towards the substrate 101 as a bottom emission type. In this case, the pixel electrode 211 may include a transparent or translucent electrode, and the opposite electrode 215 may include a reflective electrode. The flexible display apparatus 10 may be a double-side emission type apparatus that emits light in both directions, i.e., to the top and the bottom.

A pixel defining layer 213 may be formed on the pixel electrode 211, and may be formed of any suitable insulating material. In some embodiments, the pixel defining layer 213 exposes a set or predetermined region of the pixel electrode 211, and the intermediate layer 214 including the organic emission layer is located in the exposed region.

The organic emission layer may be formed of a low-molecular organic material or a high-molecular organic material. Besides the organic emission layer, the intermediate layer 214 may further selectively include function layers, such as a hole transport layer (HTL), a hole injection layer (HIL), an electron transport layer (ETL), an electron injection layer (EIL), or the like.

The encapsulating layer 300 may be formed on the opposite electrode 215. The encapsulating layer 300 may include at least a first inorganic layer 301, a first organic layer 302, and a second inorganic layer 303. A protective layer 220 may be further formed between the encapsulating layer 300 and the display unit 200.

The protective layer 220 will now be described in more detail with reference to FIG. 4.

The protective layer 220 may include a capping layer 222 that covers the opposite electrode 215 and a blocking layer 224 formed on the capping layer 222.

The capping layer 222 may be formed to cover the opposite electrode 215. The capping layer 222 may be formed of an organic material, such as a-neodymium pyrocatechin disulfonate (a-NPD), N,N'-diphenyl-N,N'-bis(1-naphthyl)(1,1'-biphenyl)-4,4'diamine (NPB), N,N-diphenyl-N,N-bis(3-methylphenyl)(1,1-biphenyl)-4,4 diamine (TPD), 4,4',4"-tris(phenyl-m-tolylamino)triphenylamine (m-MT-DATA), tris-(8-hydroxyquinolate) aluminum (Alq$_3$), copper phthalocyanine (CuPc), or the like, and may function to not only protect the organic light-emitting device OLED, but also aid in efficient emission of light generated by the organic light-emitting device OLED. The capping layer 222 may be formed with the thickness of about 20 nm to about 200 nm. A distance from the edge of the opposite electrode 215 to the edge of the capping layer 222 may be from about 50 μm to about 150 μm.

The blocking layer 224 may be formed of an inorganic material, such as LiF, MgF$_2$, CaF$_2$, or the like. The blocking layer 224 functions to effectively prevent plasma and the like, used in a process of forming the first inorganic layer 301, from infiltrating into the organic light-emitting device OLED so as not to damage the intermediate layer 214, the opposite electrode 215, and the like. The blocking layer 224 may be formed with the thickness of about 30 nm to about 200 nm. A distance from the edge of the capping layer 222 to the edge of the blocking layer 224 may be from about 50 μm to about 150 μm.

The blocking layer 224 may have a large dipole moment. In the embodiments, when the blocking layer 224 contacts the opposite electrode 215, the large dipole moment of the blocking layer 224 affects the opposite electrode 215, and as a result, an oxidation reaction may occur on the surface of the opposite electrode 215. The oxidation of the opposite electrode 215 may lead to a pixel shrinkage phenomenon of the organic light-emitting device OLED. For example, when the opposite electrode 215 is formed of Mg, and the blocking layer 224 is formed of LiF, an oxidation reaction according to a chemical formula 1 may occur.

$$2\text{LiF} + \text{Mg} \rightarrow \text{MgF}_2 + 2\text{Li} \qquad \text{(Chemical formula 1)}$$

The oxidation of the opposite electrode 215, according to the chemical formula 1, may lead to a pixel shrinkage phenomenon of the organic light-emitting device OLED. According to an embodiment of the present invention, the capping layer 222 is formed to fully cover the opposite electrode 215, thereby effectively preventing the contact of the blocking layer 224 with the opposite electrode 215. Thus, the surface reaction between the blocking layer 224 and the opposite electrode 215, and subsequent oxidation of the opposite electrode 215, may be effectively prevented. Accordingly, a pixel shrinkage phenomenon, which occurs due to the oxidation of the opposite electrode 215, may be effectively prevented.

In some embodiments, the first inorganic layer 301 is formed on the protective layer 220. The first inorganic layer 301 may be formed of, for example, an aluminum oxide (AlO$_x$).

The first organic layer 302 may be formed on the first inorganic layer 301 and may be formed of a high-molecular organic compound. The first organic layer 302 may be formed with a set or predetermined thickness to planarize (even out) a level difference due to the pixel defining layer 213. The first organic layer 302 may include any one of epoxy, acrylate, and urethane acrylate. An area of the first organic layer 302 may be less than that of the first inorganic layer 301. The area of the first organic layer 302 may be greater than that of the blocking layer 224. Accordingly, the expansion of the area of the first organic layer 302 may effectively prevent the infiltration of humidity from the outside of a panel into the organic light-emitting device.

In some embodiments, the second inorganic layer 303 is formed to surround the first inorganic layer 301 and the first organic layer 302. Thus, since the entire first organic layer 302 is surrounded by the first inorganic layer 301 and the second inorganic layer 303, the infiltration of external humidity and oxygen into the organic light-emitting device may be effectively prevented.

The second inorganic layer 303 may be formed of, for example, SiN$_x$ or SiO$_x$, and may be formed with a set or predetermined thickness by chemical vapor deposition (CVD). Thus, even though particles exist on the first organic layer 302, a level difference formed due to the particles may be sufficiently covered. In addition, since the second inorganic layer 303 is formed by CVD in which plasma is not used, the first organic layer 302 may be protected from being damaged when the second inorganic layer 303 is formed, and a discharge of gas from the first organic layer 302 may be effectively prevented.

The second inorganic layer 303 may be formed to be larger than the first inorganic layer 301 and may directly contact the interlayer insulating layer 205 outside the active area AA. In addition, the second inorganic layer 303 may be formed of the same material as the interlayer insulating layer 205. Accordingly, a bonding force between the second inorganic layer 303 and the interlayer insulating layer 205 may increase.

A second organic layer 304 and a third inorganic layer 305 may be formed on the second inorganic layer 303, and although not shown, a fourth inorganic layer of AlO$_x$ may be further formed on the outer surface of the encapsulating layer 300.

The second organic layer 304 may include any one of epoxy, acrylate, and urethane acrylate and may be formed with a set or predetermined thickness. In some embodiments, the second organic layer 304 alleviates a film stress exerted onto the first inorganic layer 301, and even though particles or the like exist, the second organic layer 304 covers the particles or the like for planarization. An area of the second organic layer 304 may be greater than that of the first organic layer 302. Accordingly, the expansion of the area of the second organic layer 304 may effectively prevent the infiltration of humidity into the organic light-emitting device from the outside of the panel.

In some embodiments, the third inorganic layer 305 covers the second organic layer 304. The third inorganic layer 305 may be formed of the same material as the second inorganic layer 303. The third inorganic layer 305 may be formed to be larger than the second inorganic layer 303 and may directly contact the interlayer insulating layer 205 outside the active area AA. In addition, the third inorganic layer 305 may be formed of the same material as the interlayer insulating layer 205. Accordingly, a bonding force between the third inorganic layer 305 and the interlayer insulating layer 205 may increase.

The encapsulating layer 300 may further include a plurality of additional inorganic layers and a plurality of additional organic layers that are alternately stacked, and the number of stacks of the inorganic layers and the organic layers is not limited to the embodiments of the present invention.

In one embodiment, a protective film is attached to the upper surface of the encapsulating layer 300. However, when an attachment force of the protective film is strong, the encapsulating layer 300 may be peeled off when the protective film is removed. Thus, a fourth inorganic layer of AlO$_x$ having a weak attachment force to the protective film may be further formed to remedy this problem.

Figure 5:
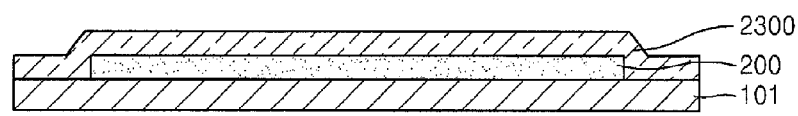
FIG. 5 is a schematic cross-sectional view of an organic light-emitting display apparatus, according to another embodiment of the present invention.
Figure 6:
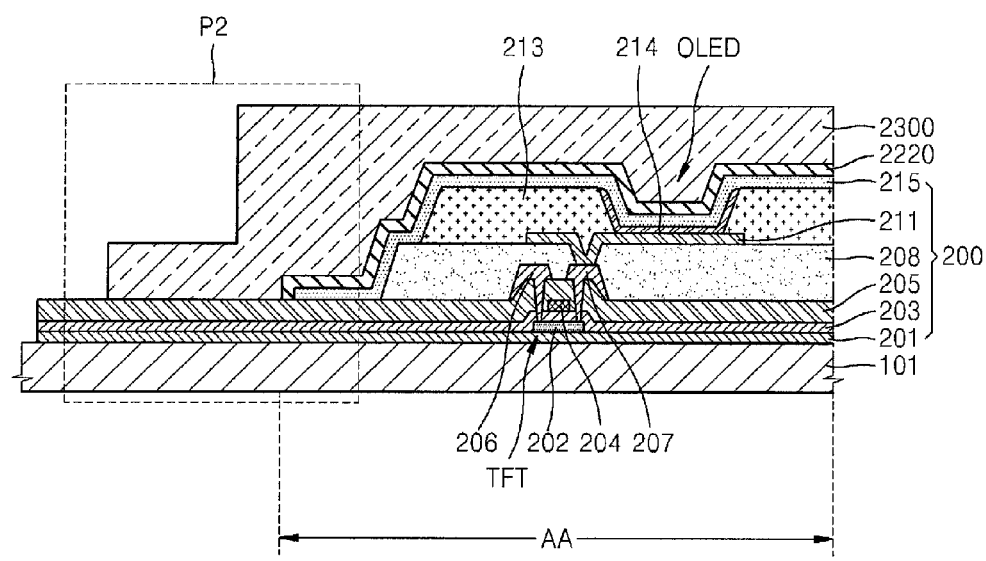
FIG. 6 is a cross-sectional magnified view of a region of the organic light-emitting display apparatus of FIG. 5.
Figure 7:
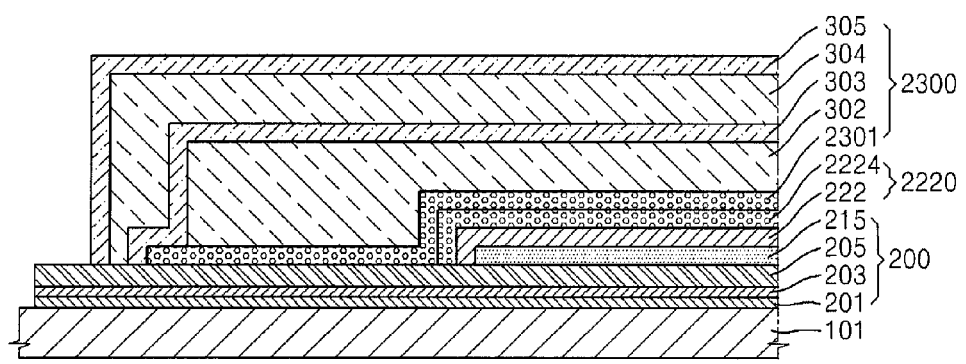
FIG. 7 is a magnified view of a region P2 in FIG. 6.

FIG. 5 is a schematic cross-sectional view of an organic light-emitting display apparatus 20 according to another embodiment of the present invention, FIG. 6 is a cross-sectional view of a portion of the organic light-emitting display apparatus 20 of FIG. 5, and FIG. 7 is a magnified view of a portion P2 in FIG. 6.

Referring to FIGS. 5 to 7, the organic light-emitting display apparatus 20 according to embodiments of the present invention may include the substrate 101, the display unit 200 that defines the active area AA on the substrate 101, and an encapsulating layer 2300 that seals up the display unit 200.

The substrate 101 may be a flexible substrate. However, one or more embodiments of the present invention are not limited thereto, and the substrate 101 may be formed of various suitable materials, such as a metal, glass, or the like.

The display unit 200 defines the active area AA on the substrate 101 and may include the thin film transistor TFT and the organic light-emitting device OLED electrically connected to the thin film transistor TFT. The pad part 1 may be disposed around the active area AA to deliver an electrical signal from a power supply device or a signal generation device to the active area AA.

The display unit 200 will now be described in more detail with reference to FIG. 6.

The buffer layer 201 may be formed on the substrate 101. The thin film transistor TFT may be formed on the buffer layer 201. The thin film transistor TFT may include the active layer 202, the gate electrode 204, the source electrode 206, and the drain electrode 207.

The gate insulating layer 203 may be formed on the active layer 202. In some embodiments, the gate insulating layer 203 is formed to correspond to the entire surface of the substrate 101.

The gate electrode 204 may be formed on the gate insulating layer 203.

The interlayer insulating layer 205 may be formed on the gate electrode 204. In some embodiments, the interlayer insulating layer 205 is formed to correspond to the entire surface of the substrate 101. That is, the interlayer insulating layer 205 is formed to correspond to the active area AA and the outer area outside of the active area AA.

The interlayer insulating layer 205 may be formed of an inorganic material, such as $SiN_x$, $SiO_2$, or the like. In the current embodiment, the interlayer insulating layer 205 may be formed of $SiN_x$ or may be a two-layer structure including an $SiN_x$ layer and an $SiO_2$ layer.

The source electrode 206 and the drain electrode 207 may be formed on the interlayer insulating layer 205.

Although FIG. 6 illustrates the thin film transistor TFT of a top-gate type that sequentially includes the active layer 202, the gate electrode 204 and the source and drain electrodes 206 and 207, one or more of the above embodiments of the present invention are not limited thereto, and the gate electrode 204 may be disposed below the active layer 202.

The thin film transistor TFT is electrically connected to the organic light-emitting device OLED to drive the organic light-emitting device OLED and is protected by the passivation layer 208 that covers the thin film transistor TFT.

The passivation layer 208 may include an inorganic insulating layer and/or an organic insulating layer. The passivation layer 208 may be formed as a complex stacked body of an inorganic insulating layer and an organic insulating layer.

The organic light-emitting device OLED may be formed on the passivation layer 208 and may include the pixel electrode 211, the intermediate layer 214, and the opposite electrode 215.

The pixel electrode 211 may be formed on the passivation layer 208 to face the pixel electrode 211. The opposite electrode 215 may be a transparent or translucent electrode and may be formed of a metal thin film having a small work function, including Li, Ca, LiF/Ca, LiF/Al, Al, Ag, Mg or a compound thereof. The opposite electrode 215 may be formed with the thickness of about 5 nm to about 20 nm.

Thus, the opposite electrode 215 may allow the light emitted by the organic emission layer included in the intermediate layer 214 to pass through. That is, the light emitted by the organic emission layer may be directly emitted towards the opposite electrode 215 or be reflected by the pixel electrode 211 including a reflective electrode and then emitted towards the opposite electrode 215.

However, the flexible display apparatus 20 according to the current embodiment is not limited to a top emission type, and the light emitted by the organic emission layer may be emitted towards the substrate 101 as a bottom emission type. In this case, the pixel electrode 211 may include a transparent or translucent electrode, and the opposite electrode 215 may include a reflective electrode. The flexible display apparatus 20 may be a double-side emission type to emit light in both directions, i.e., to the top and the bottom.

The pixel defining layer 213 may be formed on the pixel electrode 211.

The organic emission layer included in the intermediate layer 214 may be formed of a low-molecular organic material or a high-molecular organic material. Besides the organic emission layer, the intermediate layer 214 may further selectively include function layers, such as an HTL, an HIL, an ETL, an EIL, or the like.

The encapsulating layer 2300 is disposed opposite to the electrode 215. The encapsulating layer 2300 may include at least a porous inorganic layer 2301, the first organic layer 302, and the second inorganic layer 303. A protective layer 2220 may be further formed between the encapsulating layer 2300 and the display unit 200.

The protective layer 2220 will now be described in more detail with reference to FIG. 7.

The protective layer 2220 may include the capping layer 222 that covers the opposite electrode 215, and a porous blocking layer 2224 formed on the capping layer 222.

The capping layer 222 may be formed to cover the opposite electrode 215. The capping layer 222 may be formed of an organic material, such as a-NPD, NPB, TPD, m-MTDATA, Alq$_3$, CuPc, or the like and may function to not only protect the organic light-emitting device OLED, but also aid in efficient emission of light generated by the organic light-emitting device OLED. The capping layer 222 may be formed with the thickness of about 20 nm to about 200 nm. A distance from the edge of the opposite electrode 215 to the edge of the capping layer 222 may be from about 50 µm to about 150 µm.

The porous blocking layer 2224 may be formed of an inorganic material, such as LiF, MgF$_2$, CaF$_2$, or the like. In some embodiments, the porous blocking layer 2224 functions to block plasma and the like used in a process of forming the first inorganic layer 301 from infiltrating into the organic light-emitting device OLED so as not to damage the intermediate layer 214, the opposite electrode 215, and the like. The porous blocking layer 2224 may be formed with the thickness of about 30 nm to about 200 nm. A distance from the edge of the capping layer 222 to the edge of the porous blocking layer 2224 may be from about 50 µm to about 150 µm. In the current embodiment, the porous blocking layer 2224 may be formed of LiF having a pin-hole structure.

The porous blocking layer 2224 may have a large dipole moment. In embodiments when the porous blocking layer 2224 contacts the opposite electrode 215, the large dipole moment of the porous blocking layer 2224 affects the opposite electrode 215, and as a result, an oxidation reaction may occur on the surface of the opposite electrode 215. The oxidation of the opposite electrode 215 may lead to a pixel shrinkage phenomenon of the organic light-emitting device OLED. For example, when the opposite electrode 215 is formed of Mg, and the porous blocking layer 2224 is formed of LiF, an oxidation reaction according to the chemical formula 1 may occur.

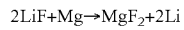

2LiF+Mg→MgF$_2$+2Li  (Chemical formula 1)

Here, the oxidation reaction of the opposite electrode 215, according to the chemical formula 1, may lead to a pixel shrinkage phenomenon of the organic light-emitting device OLED. According to an embodiment of the present invention, the capping layer 222 is formed to fully cover the opposite electrode 215, thereby effectively preventing the contact of the porous blocking layer 2224 with the opposite electrode 215. Thus, the surface reaction between the porous blocking layer 2224 and the opposite electrode 215, and subsequent oxidation of the opposite electrode 215, may be effectively prevented. Accordingly, a pixel shrinkage phenomenon, which occurs due to the oxidation of the opposite electrode 215, may be effectively prevented.

In some embodiments, the porous inorganic layer 2301 is formed on the protective layer 2220. The porous inorganic layer 2301 may be formed of, for example, AlO$_x$. The porous inorganic layer 2301 may be formed with a set or predetermined thickness by a sputtering method. In some embodiments the porous inorganic layer 2301 may be formed on the porous blocking layer 2224. When the porous inorganic layer 2301 is formed on the porous blocking layer 2224, the porous inorganic layer 2301 is grown according to a crystalline structure of the porous blocking layer 2224. That is, fine cracks may exist on the porous inorganic layer 2301 formed on the porous LiF of the porous blocking layer 2224 having a pin-hole structure.

The first organic layer 302 may be formed on the porous inorganic layer 2301. The first organic layer 302 may be formed of a high-molecular organic compound. In some embodiments the high-molecular organic compound may outgas, and the discharged gas may infiltrate towards the organic light-emitting device OLED. If an inorganic layer is broken and cracked due to a particle or the like, the gas discharged from the high-molecular organic compound may converge into the crack on the inorganic layer, and accordingly, a corresponding point of the opposite electrode 215 of the organic light-emitting device OLED may be oxidized, thereby causing a dark spot.

However, according to the current embodiment, since the porous inorganic layer 2301 and the porous blocking layer 2224 have fine cracks, a gas discharged from the first organic layer 302 does not converge into any one point. Since the gas discharged from the first organic layer 302 can be widely spread due to the fine cracks existing on the porous inorganic layer 2301 and the porous blocking layer 2224, the opposite electrode 215 may be protected from oxidation at only any one point, and accordingly, the formation of the dark spot may be effectively prevented. That is, since it may be effectively prevented due to an average effect that substances damaging the opposite electrode 215 and the intermediate layer 214, such as a gas discharged from the first organic layer 302 and the like, converge into a certain portion, a partial damage of the opposite electrode 215 and the intermediate layer 214 may be restrained, thereby delaying a dark spot. In the present application, "the average effect" refers to the fact that an outgas substance does not converge into one portion but is substantially spread out. In contrast, when an elaborate film, through which an outgas substance is difficult to be spread, is used instead of a porous film, the outgas substance may concentrate through a defect portion of the elaborate film, i.e., a pin-hole due to a foreign substance or a scratch, and thus may converge into the defect portion. As a result, the intermediate layer 214 between the opposite electrode 215 and the pixel electrode 211 may be damaged and a dark spot may occur. In some cases, a continuously growing dark spot, so-called progressive dark spot, may occur. In embodiments of the present invention, however, by using the porous blocking layer 2224 and the porous inorganic layer 2301, an outgas substance does not partially converge into a defect portion but is generally and uniformly spread due to the average effect, and a progressive dark spot does not occur. Accordingly, the life span of the organic light-emitting display apparatus 20 may extend, thereby improving the reliability of a product.

In some embodiments, the first organic layer 302 is formed on the porous inorganic layer 2301. The first organic layer 302 may be formed with a set or predetermined thickness to planarize a level difference due to the pixel defining layer 213. The first organic layer 302 may include any one of epoxy, acrylate, and urethane acrylate. The area of the first organic layer 302 may be less than that of the porous inorganic layer 2301. The area of the first organic layer 302 may be greater than that of the porous blocking layer 2224. Accordingly, the expansion of the area of the first organic layer 302 may effectively prevent the infiltration of humidity into the organic light-emitting device from the outside of a panel.

In some embodiments, the second inorganic layer 303 is formed to surround the porous inorganic layer 2301 and the first organic layer 302. That is, since the entire first organic layer 302 is surrounded by the porous inorganic layer 2301 and the second inorganic layer 303, the infiltration of external humidity and oxygen into the organic light-emitting device may be effectively prevented.

The second inorganic layer 303 may be formed of, for example, $SiN_x$ or $SiO_x$, and may be formed with a set or predetermined thickness by CVD. Thus, even though particles exist on the first organic layer 302, a level difference formed due to the particles may be sufficiently covered. In addition, since the second inorganic layer 303 is formed by CVD in which plasma is not used, the first organic layer 302 may be protected from being damaged when the second inorganic layer 303 is formed, and a discharge of gas from the first organic layer 302 may be effectively prevented.

The second inorganic layer 303 may be formed to be larger than the porous inorganic layer 2301 and may directly contact the interlayer insulating layer 205 outside the active area AA. In addition, the second inorganic layer 303 may be formed of the same material as the interlayer insulating layer 205. Accordingly, a bonding force between the second inorganic layer 303 and the interlayer insulating layer 205 may increase.

The second organic layer 304 and the third inorganic layer 305 may be formed on the second inorganic layer 303, and although not shown, a fourth inorganic layer of $AlO_x$, may be further formed on the outer surface of the encapsulating layer 300.

The second organic layer 304 may include any one of epoxy, acrylate, and urethane acrylate and may be formed with a set or predetermined thickness. In some embodiments, the second organic layer 304 alleviates a film stress exerted onto the porous inorganic layer 2301, and even though particles or the like exist, the second organic layer 304 covers the particles or the like for planarization. An area of the second organic layer 304 may be greater than that of the first organic layer 302. Accordingly, the expansion of the area of the second organic layer 304 may effectively prevent the infiltration of humidity into the organic light-emitting device from the outside of the panel.

In some embodiments, the third inorganic layer 305 covers the second organic layer 304. The third inorganic layer 305 may be formed of the same material as the second inorganic layer 303. The third inorganic layer 305 may be formed to be larger than the second inorganic layer 303 and may directly contact the interlayer insulating layer 205 outside the active area AA. In addition, the third inorganic layer 305 may be formed of the same material as the interlayer insulating layer 205. Accordingly, a bonding force between the third inorganic layer 305 and the interlayer insulating layer 205 may increase.

The encapsulating layer 300 may further include a plurality of additional inorganic layers and a plurality of additional organic layers that are alternately stacked, and the number of stacks of the inorganic layers and the organic layers is not limited to the embodiments of the present invention.

In some embodiments, a protective film is attached to the upper surface of the encapsulating layer 300. However, if an attachment force of the protective film is strong, the encapsulating layer 300 may be peeled off when the protective film is removed. Thus, a fourth inorganic layer formed of AlOx having a weak attachment force to the protective film may be further formed to remedy this problem.

Figure 8:
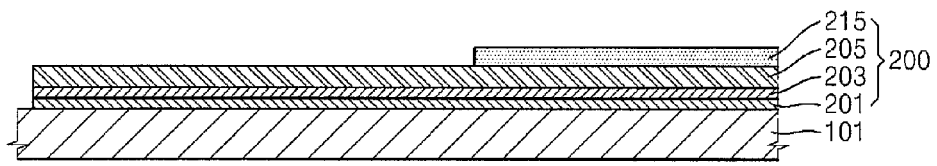
FIGS. 8 to 10 are schematic cross-sectional views for describing a method of manufacturing the organic light-emitting display apparatus of FIG. 1, according to an embodiment of the present invention.
Figure 9:
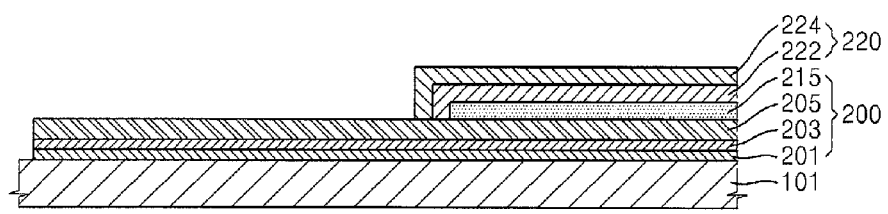
Figure 10:
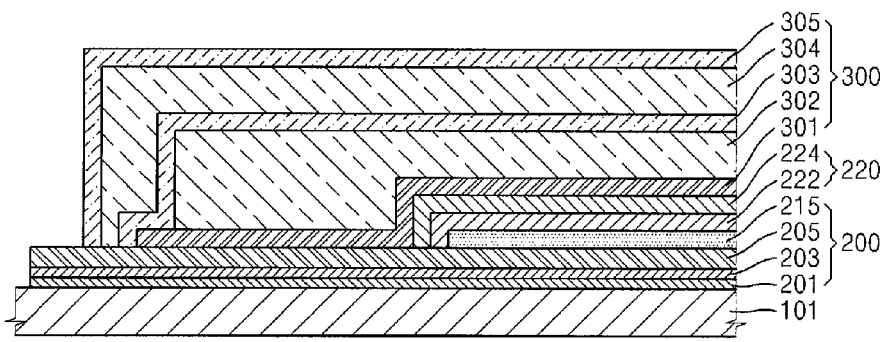

FIGS. 8 to 10 are schematic cross-sectional views for describing a method of manufacturing the organic light-emitting display apparatus 10 of FIG. 1, according to an embodiment of the present invention. Since the display unit 200 is substantially the same as described with reference to FIG. 3, the detailed description of the configuration of the display unit 200 is not provided again in FIGS. 8 to 10.

The method of manufacturing the organic light-emitting display apparatus 10 will now be described with reference to FIGS. 8 to 10 and FIG. 4 together.

As shown in FIG. 8, the display unit 200 that defines the active area AA is formed on the substrate 101. Since the display unit 200 may have the configuration illustrated in FIG. 3, and various suitable organic light-emitting displays may be applied thereto, a detailed method of manufacturing the display unit 200 is not provided here. In some embodiments, the display unit 200 includes the buffer layer 201 formed up to the outer area of the active area AA, the gate insulating layer 203, and the interlayer insulating layer 205. In some embodiments, the interlayer insulating layer 205 is disposed between the gate electrode (204 of FIG. 3) and the source electrode (206 of FIG. 3), and in some embodiments between the gate electrode (204 of FIG. 3) and the drain electrode (207 of FIG. 3), for insulation therebetween, and may be formed of an inorganic material, such as $SiN_x$, $SiO_2$, or the like.

As shown in FIG. 9, the protective layer 220 may be formed on the display unit 200.

In some embodiments, the protective layer 220 includes the capping layer 222 which may be formed of an organic material, such as a-NPD, NPB, TPD, m-MTDATA, Alq$_3$, CuPc, or the like, and the blocking layer 224 which may be formed of LiF.

In some embodiments, the capping layer 222 is formed to cover the opposite electrode 215. In some embodiments, the capping layer 222 is formed to fully cover the opposite electrode 215, thereby effectively preventing the blocking layer 224 from contacting the opposite electrode 215. Thus, the surface reaction between the blocking layer 224 and the opposite electrode 215, and subsequent oxidation of the opposite electrode 215, may be effectively prevented. Accordingly, a pixel shrinkage phenomenon, which occurs due to the oxidation of the opposite electrode 215, may be effectively prevented.

As shown in FIG. 10, the first inorganic layer 301, the first organic layer 302, the second inorganic layer 303, the second organic layer 304, and the third inorganic layer 305 may be sequentially formed.

The first inorganic layer 301 may be formed of $AlO_x$, and may be formed with a set or predetermined thickness by a sputtering method.

According to another embodiment of the present invention, fine cracks on the first inorganic layer 301 are created by making LiF generally have a pin-hole structure and growing the first inorganic layer 301 deposited on the blocking layer 224 according to a crystalline structure of the blocking layer 224. Accordingly, even though a gas is discharged from the first organic layer 302 and the like formed on the first inorganic layer 301, the discharged gas may be widely spread the fine cracks existing on the first inorganic layer 301 and the blocking layer 224 may effectively prevent the discharged gas from converging into any one point (average effect). Thus, the oxidation of the opposite electrode 215 and the occurrence of a dark spot thereby may be effectively prevented.

The first organic layer 302 may be formed with a set or predetermined thickness to planarize a level difference due to the pixel defining layer (213 of FIG. 3). The first organic layer 302 may include any one of epoxy, acrylate, and urethane acrylate. The area of the first organic layer 302 may be greater than that of the blocking layer 224 and less than that of the first inorganic layer 301. Accordingly, the expansion of the area of the first organic layer 302 may effectively prevent the infiltration of humidity into the organic light-emitting device from the outside of a panel.

The second inorganic layer 303 is formed to surround the first inorganic layer 301 and the first organic layer 302. That is, since the entire first organic layer 302 is surrounded by the first inorganic layer 301 and the second inorganic layer 303, the infiltration of external humidity and oxygen may be effectively prevented.

The second inorganic layer 303 may be formed of, for example, $SiN_x$ with a set or predetermined thickness by CVD. Thus, even though particles exist on the first organic layer 302, a level difference formed due to the particles may be sufficiently covered. In addition, since the second inorganic layer 303 is formed by CVD in which plasma is not used, the first organic layer 302 may be protected from being damaged when the second inorganic layer 303 is formed, thereby effectively preventing a discharge of gas from the first organic layer 302.

In some embodiments, the second inorganic layer 303 is formed to be larger than the first inorganic layer 301 and to directly contact the interlayer insulating layer 205 outside the active area AA. In addition, the second inorganic layer 303 may be formed of the same material as the interlayer insulating layer 205. In this case, a bonding force between the second inorganic layer 303 and the interlayer insulating layer 205 may increase. Thus, since the second inorganic layer 303 is formed with enough thickness to cover particles, even when a film stress increases, the second inorganic layer 303 may be protected from peeling off, and accordingly, the infiltration of external humidity and oxygen into the organic light-emitting device may be effectively prevented.

The second organic layer 304 may include any one of epoxy, acrylate, and urethane acrylate and may be formed with a set or predetermined thickness. In some embodiments, the second organic layer 304 alleviates a film stress exerted onto the first inorganic layer 301, and even though particles or the like exist, the second organic layer 304 covers the particles or the like for planarization.

In some embodiments, the third inorganic layer 305 covers the second organic layer 304. The third inorganic layer 305 may be formed by CVD, thereby effectively preventing the damage to the second organic layer 304.

The encapsulating layer 300 may further include a plurality of additional inorganic layers and a plurality of additional organic layers that are alternately stacked, and the number of stacks of the inorganic layers and the organic layers is not limited to the embodiments of the present invention.

As described above, according to the one or more of the above embodiments of the present invention, the oxidation of an opposite electrode may be effectively prevented, thereby improving a pixel shrinkage problem.

In addition, the appearance of a progressive dark spot may be delayed, thereby improving the life span of an organic light-emitting display apparatus.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims and equivalents thereof.

What is claimed is:

1. An organic light-emitting display apparatus comprising:
    a substrate;
    a display unit having a plurality of organic light-emitting devices on the substrate;
    an insulating layer between the substrate and at least one of the plurality of organic light-emitting devices;
    an encapsulating layer sealing up the display unit; and
    a protective layer between the display unit and the encapsulating layer,
    wherein each of the plurality of organic light-emitting devices comprises:
        a pixel electrode,
        an intermediate layer on the pixel electrode, the intermediate layer comprising an organic emission layer, and
        an opposite electrode on the intermediate layer; and
    the protective layer comprises:
        a capping layer covering a top surface and side surfaces of the opposite electrode, and
        a blocking layer on the capping layer, the blocking layer being formed of an inorganic material,
    wherein the blocking layer covers a top surface and side surfaces of the capping layer, and the blocking layer is separate from the opposite electrode,
    wherein the capping layer comprises an overlap region overlapping with the opposite electrode, and the overlap region of the capping layer entirely contacts the blocking layer, and
    wherein the encapsulating layer comprises a first inorganic layer, a first organic layer on the first inorganic layer, and a second inorganic layer on the first organic layer,
    the first inorganic layer covers a top surface and a side surface of the capping layer,
    the first inorganic layer comprises an overlap region overlapping with the opposite electrode, and the overlap region of the first inorganic layer entirely contacts a top surface of the blocking layer,
    the first organic layer is formed to be spaced apart from the blocking layer and the capping layer, and
    the second inorganic layer is in contact with a region of the first inorganic layer and is spaced apart from the blocking layer and the capping layer.

2. The organic light-emitting display apparatus of claim 1, wherein the blocking layer is formed of a lithium fluoride (LiF).

3. The organic light-emitting display apparatus of claim 1, wherein the encapsulating layer has a structure comprising a first inorganic layer, a first organic layer, and a second inorganic layer that are sequentially stacked.

4. The organic light-emitting display apparatus of claim 3, wherein the first inorganic layer is formed of an aluminum oxide ($AlO_x$).

5. The organic light-emitting display apparatus of claim 3, wherein an area of the first organic layer is greater than that of the blocking layer.

6. The organic light-emitting display apparatus of claim 3, wherein an area of the first inorganic layer is greater than that of the first organic layer.

7. The organic light-emitting display apparatus of claim 3, wherein the encapsulating layer further comprises:
 a second organic layer on the second inorganic layer; and
 a third inorganic layer on the second organic layer.

8. The organic light-emitting display apparatus of claim 7, wherein an area of the first inorganic layer is greater than that of the first organic layer.

9. The organic light-emitting display apparatus of claim 7, wherein an area of the first organic layer is greater than that of the blocking layer, and an area of the second organic layer is greater than that of the first organic layer.

10. The organic light-emitting display apparatus of claim 7, wherein an area of each of the second inorganic layer and the third inorganic layer is greater than that of the first inorganic layer.

11. An organic light-emitting display apparatus comprising:
 a substrate;
 a display unit having a plurality of organic light-emitting devices on the substrate;
 an insulating layer between the substrate and at least one of the plurality of organic light-emitting devices;
 an encapsulating layer sealing up the display unit and comprising a porous inorganic layer, a first organic layer, and a second inorganic layer that are sequentially stacked; and
 a protective layer between the display unit and the encapsulating layer,
 wherein each of the plurality of organic light-emitting devices comprises:
  a pixel electrode,
  an intermediate layer on the pixel electrode, the intermediate layer comprising an organic emission layer, and
  an opposite electrode on the intermediate layer, and
 the protective layer comprises:
  a capping layer covering the opposite electrode, and
  a porous blocking layer on the capping layer, the porous blocking layer being formed of an inorganic material,
 wherein the porous blocking layer covers a top surface and side surfaces of the capping layer, and the porous blocking layer is separate from the opposite electrode, and
 wherein the porous inorganic layer covers a top surface and a side surface of the capping layer,
 the porous inorganic layer comprises an overlap region overlapping with the opposite electrode, and the overlap region of the porous inorganic layer entirely contacts a top surface of the porous blocking layer,
 the first organic layer is formed to be spaced apart from the porous blocking layer and the capping layer, and
 the second inorganic layer is in contact with a region of the porous inorganic layer and is spaced apart from the porous blocking layer and the capping layer.

12. The organic light-emitting display apparatus of claim 11, wherein the porous blocking layer is formed of a lithium fluoride (LiF).

13. The organic light-emitting display apparatus of claim 11, wherein the porous inorganic layer is formed of an aluminum oxide ($AlO_x$).

14. The organic light-emitting display apparatus of claim 11, wherein an area of the first organic layer is greater than that of the porous blocking layer.

15. The organic light-emitting display apparatus of claim 11, wherein an area of the porous inorganic layer is greater than that of the first organic layer.

16. The organic light-emitting display apparatus of claim 11, wherein the encapsulating layer further comprises:
 a second organic layer on the second inorganic layer; and
 a third inorganic layer on the second organic layer.

17. The organic light-emitting display apparatus of claim 16, wherein an area of the porous inorganic layer is greater than that of the first organic layer.

18. The organic light-emitting display apparatus of claim 16, wherein an area of the first organic layer is greater than that of the porous blocking layer, and an area of the second organic layer is greater than that of the first organic layer.

19. The organic light-emitting display apparatus of claim 16, wherein an area of each of the second inorganic layer and the third inorganic layer is greater than that of the porous inorganic layer.

20. A method of manufacturing an organic light-emitting display apparatus, the method comprising:
 forming a display unit on a substrate, the display unit defining an active area and comprising an opposite electrode;
 forming an insulating layer between the substrate and the display unit;
 forming a capping layer to cover a top surface and side surfaces of the opposite electrode,
 forming a blocking layer on the capping layer, the blocking layer being formed of an inorganic material; and
 forming an encapsulating layer on the blocking layer to seal up the display unit,
 wherein the blocking layer covers a top surface and side surfaces of the capping layer, and the blocking layer is separate from the opposite electrode,
 wherein the capping layer comprises an overlap region overlapping with the opposite electrode, and the overlap region of the capping layer entirely contacts the blocking layer, and
 wherein the encapsulating layer comprises a first inorganic layer, a first organic layer on the first inorganic layer, and a second inorganic layer on the first organic layer,
 the first inorganic layer covers a top surface and a side surface of the capping layer,
 the first inorganic layer comprises an overlap region overlapping with the opposite electrode, and the overlap region of the first inorganic layer entirely contacts a top surface of the blocking layer,
 the first organic layer is formed to be spaced apart from the blocking layer and the capping layer, and
 the second inorganic layer is in contact with a region of the first inorganic layer and is spaced apart from the blocking layer and the capping layer.

21. The method of claim 20, wherein the blocking layer is formed of a lithium fluoride (LiF).

22. The method of claim 20, wherein the forming of the encapsulating layer comprises:
 forming a first inorganic layer on the blocking layer;
 forming a first organic layer on the first inorganic layer; and
 forming a second inorganic layer on the first organic layer.

23. The method of claim 22, wherein the first inorganic layer is formed of an aluminum oxide ($AlO_x$) by a sputtering method.

24. The method of claim 22, wherein an area of the first inorganic layer is greater than that of the first organic layer.

25. The method of claim 22, wherein an area of the first organic layer is greater than that of the blocking layer.

26. The method of claim 22, further comprising:
   forming a second organic layer on the second inorganic layer; and
   forming a third inorganic layer on the second organic layer,
   wherein the second inorganic layer and the third inorganic layer are formed by a chemical vapor deposition (CVD) method.

27. The method of claim 26, wherein an area of the first inorganic layer is greater than that of the first organic layer.

28. The method of claim 26, wherein an area of the first organic layer is greater than that of the blocking layer, and an area of the second organic layer is greater than that of the first organic layer.

29. The method of claim 26, wherein an area of each of the second inorganic layer and the third inorganic layer is greater than that of the first inorganic layer.

30. The method of claim 20, wherein the blocking layer is formed of LiF having a pin-hole structure.

31. The organic light-emitting display apparatus of claim 1, wherein a distance from an edge of the opposite electrode to an edge of the capping layer is from about 50 µm to about 150 µm.

32. The organic light-emitting display apparatus of claim 12, wherein the lithium fluoride (LiF) has a pin-hole structure.

* * * * *